United States Patent
Jacobs et al.

(10) Patent No.: US 6,822,882 B1
(45) Date of Patent: Nov. 23, 2004

(54) GATE DRIVER WITH A DC OFFSET BIAS CIRCUIT AND A POWER CONVERTER EMPLOYING THE SAME

(75) Inventors: Mark E. Jacobs, Dallas, TX (US); Subarna Pal, Mesquite, TX (US); John F. Steel, Plano, TX (US)

(73) Assignee: Tyco Electronics Power Systems, Inc., Mesquite, TX (US)

( * ) Notice: Subject to any disclaimer, the term of this patent is extended or adjusted under 35 U.S.C. 154(b) by 0 days.

(21) Appl. No.: 10/632,256

(22) Filed: Aug. 1, 2003

(51) Int. Cl.[7] .............................................. H02M 3/335
(52) U.S. Cl. .................. 363/21.06; 363/56.11
(58) Field of Search .......................... 363/21.04, 21.06, 363/56.09, 56.11

(56) References Cited

U.S. PATENT DOCUMENTS

| | | | |
|---|---|---|---|
| 5,327,333 A | * | 7/1994 | Boylan et al. ........... 363/21.04 |
| 5,636,107 A | | 6/1997 | Lu et al. |
| 5,781,420 A | | 7/1998 | Xia et al. |
| RE36,098 E | | 2/1999 | Vinciarelli |
| 5,986,899 A | | 11/1999 | Xia et al. |
| RE36,571 E | | 2/2000 | Rozman |
| 6,141,224 A | | 10/2000 | Xia et al. |
| 6,278,621 B1 | | 8/2001 | Xia et al. |

OTHER PUBLICATIONS

V. Vlatkovic, et al. "High–Voltage, High Power, ZVS, Full–Bridge PWM Converter Employing an Active Snubber" Proc. IEEE Applied Power Electronics Conf.; Mar. 1991; pp. 158–163.*

G. Hua, et al. "An Improved Zero–Voltage–Switched PWM Converter Using a Saturable Inductor" IEEE Power Electronics Specialists Conf. Rec.; 1991; pp. 189–194, no month.*

K. Harada, et al. "Switched Snubber for High Frequency Switching" IEEE Power Electronics Specialists Conf.; 1990; pp. 181–188, no month.*

R. Redl, et al. "A Novel Soft–Switching Full–Bridge DC/DC Converter. Analysis, Design Considerations and Experimental Results at 1.5 kW, 100 kHz" IEEE Power Electronics Specialists Conf. Rec.; 1990; pp. 162–172., no month.*

L.H. Mweene, et al. "A 1 kw, 500 kHz, Front–End Converter for a Distributed Power Supply System" Proc. IEEE Applied Power Electronics Conf.; Mar. 1989; pp. 423–432.*

* cited by examiner

*Primary Examiner*—Shawn Riley

(57) ABSTRACT

A gate driver and a method of driving a switch for use with a power converter having a main active clamp circuit associated with a main power switch coupled to a primary winding of a transformer and a rectifier switch coupled to a secondary winding of the transformer. The main power switch conducts during a main conduction period of the power converter and the rectifier switch conducts during an auxiliary conduction period of the power converter. In one embodiment, the gate driver includes a DC offset bias circuit, coupled to a secondary winding of the transformer, that provides a gate drive signal having a DC bias voltage to a gate terminal of the rectifier switch.

20 Claims, 3 Drawing Sheets

GATE DRIVER WITH A DC OFFSET BIAS CIRCUIT AND A POWER CONVERTER EMPLOYING THE SAME

TECHNICAL FIELD OF THE INVENTION

The present invention is directed, in general, to power electronics and, more specifically, to a gate driver, method of driving a switch and a power converter employing the same.

BACKGROUND OF THE INVENTION

A power converter is a power processing circuit that converts an input voltage waveform into a specified output voltage waveform. In many applications requiring a DC output, switched-mode DC/DC power converters are frequently employed to advantage. The switched-mode DC/DC power converters generally include an inverter, an input/output isolation transformer and a rectifier on a secondary side of the isolation transformer. The inverter generally includes a main power switch, such as a field effect transistor ("FET"), that converts the DC input voltage to an AC voltage. The input/output isolation transformer, then, transforms the AC voltage to another value and the rectifier generates the desired DC voltage at the output of the power converter. Conventionally, the rectifier includes a plurality of rectifier switches (e.g., diodes, or FETs acting as synchronous rectifier switches) that conduct the load current in response to the input waveform thereto.

The main power switch and rectifier switches are usually operated at relatively high switching frequencies such as 200–300 kHz to allow the use of smaller components such as inductors and capacitors within the power converter. As a result, parasitic or stray inductance or capacitance associated with the components of the power converter can be reduced.

The residual parasitic elements mentioned above, however, may generate high frequency oscillations that appear as undesired "ringing" or "spike" waveforms in the power converter associated with the switching transitions, particularly, those associated with the transformer and switches. The ringing or spike waveforms, which are superimposed on the waveforms associated with the normal operation of the power converter, prompt the use of higher rated and higher cost circuit components to operate in such an environment. Additionally, the deleterious ringing waveforms cause the power converter to be more lossy and less efficient. Some of the lose manifests itself as undesirable electromagnetic interference (EMI) causing regulatory problems which must be addressed. Due to the relatively small resistance values inherent in the transformer and inductor elements, the ringing energy may only be lightly damped and the voltage spike moderately attenuated in the power converter.

The spurious ringing or voltage spikes necessitate that a rectifier switch with a higher peak inverse voltage rating be employed in the power converter. For example, if the rectifier switch is employed in a power converter with a steady state output voltage of about two to three volts and, during a transition, the rectifier switch endures a reverse voltage spike causing perhaps a 80–90% rise in the off-state voltage of the rectifier switch, then the rectifier switch should be rated for roughly twice the peak inverse voltage rating (e.g., 30 volts) that it would otherwise require to avoid being damaged.

This problem is particularly severe for rectifier switches that conduct during an auxiliary conduction period (i.e., when the main power switch is not conducting; also nominally referred to a "reset" portion of the switching cycle) of the power converter. During this period, the nominal reverse voltage sustained by the rectifying switch is the input voltage of the power converter multiplied by the turns ratio of the transformer, which can be unavoidably high for higher input voltages. In addition, when the higher reverse voltage is superimposed on the non-zero voltage turn-on of the main power switch, the power converter is subject to voltage stresses that may further compromise the design thereof.

While employing a rectifier switch with a 30 volt peak inverse voltage rating in a two to three volt power converter may be acceptable because of the scarcity of commercially available and economical rectifier switches with lower voltage ratings, the problem is exacerbated in power converters with a higher steady state output voltage (e.g., 24 or 48 volts). In such circumstances, the rectifier switch may be subject to a reverse voltage spike having a peak value of 200 volts or more. While it is possible to employ rectifier switches with higher peak inverse voltage ratings (even with the higher cost and poorer performance characteristics), the benefits of exploring other circuit alternatives outweighs accepting such losses and poor efficiencies associated with using such devices.

Conventional ways of reducing the spurious ringing and voltage spikes in the power converter include a snubber circuit placed across each rectifier switch which consists of, in one example, a resistor connected in series with a capacitor. The snubber acts as a damping device to reduce the ringing and spike amplitude by dissipating a portion of the associated energy. While the snubber circuit reduces the effects of the spurious voltages associated with the rectifier switch allowing lower rated devices to be used, it also reduces the overall efficiency of the power converter. More specifically, the snubber capacitor causes more current to flow through the switches of the power converter when it conducts providing additional energy losses therein. Analogous drawbacks are provided by other passive snubber approaches such as circuits employing a diode in series with a capacitor to absorb the reverse voltage spike, and a resistor to dissipate the energy accumulated in the capacitor.

A further technique for reducing the ringing waveforms in the power converter is to place a saturable reactor in series with the rectifier switch. The saturable reactor is a nonlinear inductor that adopts a lossy characteristic change as the current therethrough increases to a point where the magnetic core material saturates. The saturation characteristic can damp the ringing waveforms by dissipating some of the ringing energy (and reducing the EMI), but it tends to become physically hot and, as a result, is often impractical to use in the power converter.

Other damping circuits such as active snubber circuits may also be used in a variety of schemes to reduce the ringing waveforms. Examples of active snubber circuits are illustrated and described in L. H. Mweene, et al., *A 1 kW, 500 kHz, front-end converter for a distributed power supply system*, Proc. IEEE Applied Power Electronics Conf., March 1989, pp. 423–432; R. Redl, et al., *A novel soft-switching full-bridge dc/dc converter: analysis, design considerations and experimental results at 1.5 kW, 100 kHz*, IEEE Power Electronics Specialists Conf. Rec., 1990, pp. 162–172; G. Hua, et al., *An improved zero-voltage-switched PWM converter using a saturable inductor*, IEEE Power Electronics Specialists Conf. Rec., 1991, pp. 189–194; K. Harada, et al., *Switched snubber for high frequency switching*, IEEE Power Electronics Specialists Conf., 1990, pp. 181–188; V. Vlatkovic, et al., *High-voltage, high-power, ZVS, full-bridge*

*PWM converter employing an active snubber*, Proc. IEEE Applied Power Electronics Conf., March, 1991, pp. 158-163. The aforementioned references are incorporated herein by reference.

Still further examples employing active snubber circuits including switches coupled to the windings of the transformer to reduce the ringing waveforms are described in U.S. Pat. No. 5,636,107 entitled DC-DC Converters, by Lu, et al., U.S. Pat. No. 5,781,420 entitled Single ended forward DC-to-DC converter providing enhanced resetting for synchronous rectification, by Xia, et al., U.S. Pat. No. 5,986,899 entitled Single ended forward DC-to-DC converter providing enhanced resetting for synchronous rectification, by Xia, et al., U.S. Pat. No. 6,141,224 entitled Single ended forward DC-to-DC converter providing enhanced resetting for synchronous rectification, by Xia, et al., U.S. Pat. No. 6,278,621 entitled Single ended forward DC-to-DC converter providing enhanced resetting for synchronous rectification, by Xia, et al., which are incorporated herein by reference.

While presently available active circuits analogous to the active snubber circuits have been employed with the main power switch of the inverter of the power converter (see, for instance, U.S. Pat. No. Re 36,098, entitled Optimal Resetting of the Transformer's Core in Single-ended Forward Converters, by Vinciarelli, which is incorporated herein by reference), such techniques can be improved to further reduce the voltage spike, particularly, across the rectifier switch that principally conducts during the auxiliary conduction period. When a FET serves as the rectifier switch that principally conducts during the auxiliary conduction period, a higher voltage FET is often necessary. The higher voltage FET, however, compromises the cost and efficiency of the power converter because the conduction and switching characteristics thereof are a function of the peak voltage rating of the switch.

Accordingly, what is needed in the art is a robust solution and circuit to reduce a voltage overshoot associated with the rectifier switch (e.g., a FET) in the power converter without significantly affecting the efficiency thereof.

SUMMARY OF THE INVENTION

To address the above-discussed deficiencies of the prior art, the present invention provides a gate driver for use with a power converter having a main active clamp circuit associated with a main power switch coupled to a primary winding of a transformer and a rectifier switch coupled to a secondary winding of the transformer. The main power switch conducts during a main conduction period of the power converter and the rectifier switch conducts during an auxiliary conduction period of the power converter. In one embodiment, the gate driver includes a DC offset bias circuit, coupled to a secondary winding of the transformer, that provides a gate drive signal having a DC bias voltage to a gate terminal of the rectifier switch.

In another aspect, the present invention provides a method of driving a switch for use with a power converter having a main active clamp circuit associated with a main power switch coupled to a primary winding of a transformer and a rectifier switch coupled to a secondary winding of the transformer. The main power switch conducts during a main conduction period of the power converter and the rectifier switch conducts during an auxiliary conduction period of the power converter. In one embodiment, the method includes coupling a DC offset bias circuit to a secondary winding of the transformer and a gate terminal of the rectifier switch. The method also includes providing a gate drive signal having a DC bias voltage via the DC offset bias circuit to a gate terminal of the rectifier switch.

In yet another aspect, the present invention provides a power converter including a main power switch coupled to an input of the power converter that conducts during a main conduction period of the power converter and a main active clamp circuit associated with the main power switch. The power converter also includes a transformer having a primary winding coupled to the main power switch, and a rectifier coupled to a secondary winding of the transformer and including a rectifier switch that conducts during an auxiliary conduction period of the power converter. The power converter still further includes a gate driver including a DC offset bias circuit, coupled to a secondary winding of the transformer, that provides a gate drive signal having a DC bias voltage to a gate terminal of the rectifier switch.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
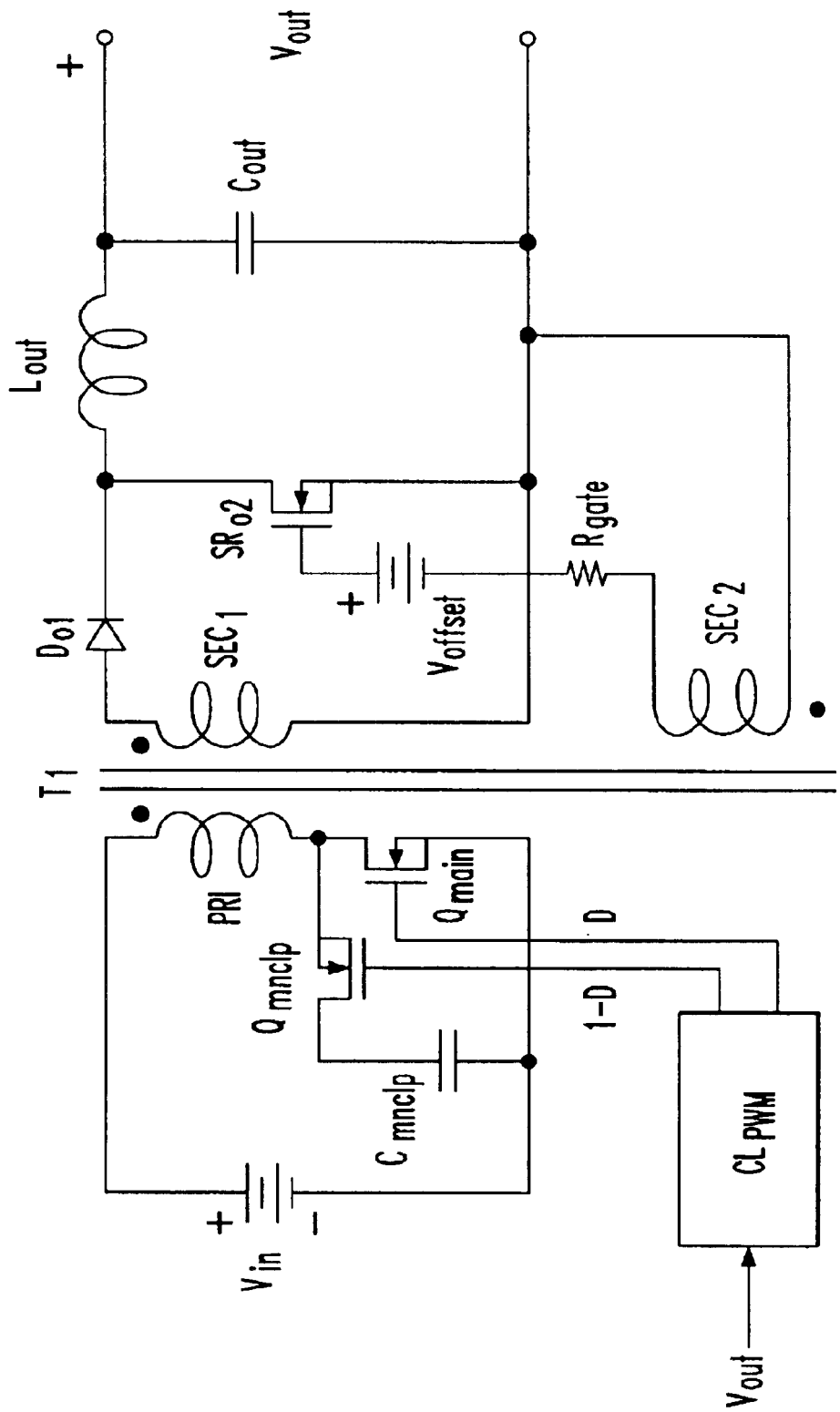
FIG. 1 illustrates a schematic diagram of an embodiment of a power converter constructed according to the principles of the present invention.

Referring initially to FIG. 1, illustrated is a schematic diagram of an embodiment of a power converter constructed according to the principles of the present invention. The power converter includes a primary power circuit or inverter driven by a controller (e.g., a pulse width modulator controller) $CL_{PWM}$, a secondary power circuit and a transformer $T_1$ having a primary winding PRI and first and second secondary windings $SEC_1$, $SEC_2$.

The primary power circuit is coupled to a source of input voltage $V_{in}$ and the primary winding PRI of the transformer $T_1$ and includes a main power switch $Q_{main}$ and a main clamp switch $Q_{mnclp}$ that is series-coupled to a main clamp capacitor $C_{mnclp}$ having a clamping voltage thereacross. In the illustrated embodiment, the main clamp switch $Q_{mnclp}$ and the main clamp capacitor $C_{mnclp}$ form a main active clamp circuit, which also functions as a main active clamp transformer reset circuit. It should be understood by those skilled in the art that the main active clamp circuit may be positioned at other locations within the power converter such as coupled to one of the first and second secondary windings $SEC_1$, $SEC_2$ of the transformer $T_1$, or coupled to an additional winding (not shown) of the transformer $T_1$ (see, for instance, U.S. Pat. No. Re 36,098 to Vinciarelli).

For the transformer winding senses shown in FIG. 1, the primary power circuit transfers power forward from the primary winding PRI to the first and second secondary windings $SEC_1$, $SEC_2$ during conduction of the main power switch $Q_{main}$ thereby providing a forward portion of an overall switching cycle {represented by a (D) portion of an overall switching cycle}. The main power switch $Q_{main}$ connects the input voltage $V_{in}$ across the primary winding PRI for a main conduction period {also represented by a (D) portion of an overall switching cycle}. At the conclusion of the main conduction period D, the primary winding PRI is coupled across a difference between the input voltage $V_{in}$ and the clamping voltage across the main clamp capacitor $C_{mnclp}$. It should be understood that the main clamp capacitor $C_{mnclp}$ may exhibit different voltage levels depending on its location and connection within the power converter (e.g., coupling the main clamp capacitor $C_{mnclp}$ to the input voltage $V_{in}$ rather than the ground as illustrated in FIG. 1).

This action is accomplished by the main clamp switch $Q_{mnclp}$, which conducts for an auxiliary conduction period {represented by a (1-D) portion of an overall switching cycle}. The auxiliary conduction period 1-D represents a transformer reset portion of the overall switching cycle that is substantially mutually exclusive of the main conduction period D. Of course, one skilled in the pertinent art realizes that there may be a small overlap or a small gap in the main conduction period D and auxiliary conduction period 1-D due to associated transition times or switching delays. The main clamp capacitor $C_{mnclp}$ allows the magnetic flux through the core of the transformer $T_1$ to be substantially reset to a value exhibited at the beginning of the main conduction period D. Both the main conduction period D and the auxiliary conduction period 1-D are controlled by the controller $CL_{PWM}$. For additional information concerning the operation of main power switch and main clamp switch see, for instance, U.S. Pat. No. Re 36,571, entitled Low loss synchronous rectifier for application to clamped-mode power converters, to Rozman, which is incorporated herein by reference.

The secondary power circuit, coupled to the first and second secondary windings $SEC_1$, $SEC_2$ of the transformer $T_1$, provides an output voltage $V_{out}$ and includes first and second rectifier switches (e.g., a diode $D_{o1}$ and a synchronous rectifier switch $SR_{o2}$), an output inductor $L_{out}$ and an output capacitor $C_{out}$. While the synchronous rectifier switch $SR_{o2}$ is a field effect transistor in the illustrated embodiment, it should be understood that any controllable switch such as a voltage controlled switch may be employed to advantage.

For the transformer winding senses shown in FIG. 1, the secondary power circuit couples a secondary voltage associated with the first secondary winding $SEC_1$ to the diode $D_{o1}$ during the main conduction period D. The secondary voltage is coupled through the diode $D_{o1}$ to the output inductor $L_{out}$. Then, during the auxiliary conduction period 1-D, an output inductor current flows through the synchronous rectifier switch $SR_{o2}$. A DC portion of the output inductor current flows through output inductor $L_{out}$ and a load (not shown) connected to an output of the power converter. An AC portion of the output inductor current flows through the output capacitor $C_{out}$, which provides a filtering function for the output voltage $V_{out}$.

During a switching transition of the rectifier switches (in this case, the diode $D_{o1}$ and the synchronous rectifier switch $SR_{o2}$) from a conducting to a non-conducting state, the rectifier switches are subject to a reverse voltage that, if left unchecked, causes deleterious ringing and spike waveforms in the power converter. A gate driver constructed according to the principles of the present invention may be employed to substantially reduce the adverse effects associated with the spiking reverse voltage phenomena and, to some extent, the ringing voltage, particularly across the synchronous rectifier switch $SR_{o2}$ during a transition from a conducting to a non-conducting state.

In the illustrated embodiment, the gate driver includes a DC offset bias circuit (e.g., a battery), coupled to the second secondary winding $SEC_2$ of the transformer $T_1$, that provides a gate drive signal having a DC bias voltage $V_{offset}$ to a gate terminal of the synchronous rectifier switch $SR_{O2}$. The gate driver also includes a gate resistor $R_{gate}$ that extends a transition time of the synchronous rectifier switch $SR_{O2}$ from a conducting state to a non-conducting state.

As mentioned above, during the auxiliary conduction period 1-D, the synchronous rectifier switch $SR_{o2}$ is conducting. At the beginning of the main conduction period D, the synchronous rectifier switch $SR_{o2}$ is transitioned to a non-conducting state. Immediately following the transition from the conducting to the non-conducting state, the synchronous rectifier switch $SR_{o2}$ generally sustains a brief spike in reverse voltage that is substantially larger than its normal operating off-state voltage. The voltage spike is an unavoidable consequence of the rectifier switch and the circuit parasitic capacitance resonating with circuit parasitic inductance. This phenomenon often results in the application of rectifier switches having a higher inverse peak voltage rating than the off-state voltage thereof, with unfavorable consequences to the cost of circuit components and power converter performance. Applying the principles of the present invention to power converters employing rectifier switches alleviates the deleterious effects associated with the reverse voltage spikes.

In order to reduce the reverse voltage spike, a temporary resistance is introduced into the parasitic resonant circuit that includes the aforementioned intrinsic circuit parasitic inductance and capacitance. This temporary resistance is obtained from the dissipative characteristic of the synchronous rectifier switch $SR_{O2}$ during its transition from a conducting to a non-conducting state. When the synchronous rectifier switch $SR_{O2}$ is conducting, the channel resistance exhibits a familiar and relatively small "on" resistance. When the synchronous rectifier switch $SR_{O2}$ is not conducting, the channel resistance is practically infinite, ignoring any small leakage current. During the switching transition from the conducting to the non-conducting state, the synchronous rectifier switch $SR_{O2}$ can be thought of as making a fast, but continuous transition between these two states, with its apparent resistance assuming a continuity of resistive values, e.g., from very small to very large. The transition time can be extended as provided with the gate resistor $R_{gate}$ to assist in dampening the negative effects associated therewith.

Additionally, if the synchronous rectifier switch $SR_{O2}$ that is transitioning to a non-conducting state has a gate voltage held above a gate threshold voltage (e.g., three to four volts for a typical n-channel FET) for a period of time, then the effects of the reverse voltage spike may be dissipated because the gate voltage is maintained above the threshold as the energy dissipates. Moreover, in systems that employ two synchronous rectifier switches, the second synchronous rectifier switch that is simultaneously transitioning to a conducting state may have a gate voltage held below a gate threshold voltage (e.g., zero volts), then one or both synchronous rectifier switches may experience a smoother transition through the respective dissipative regions. The transition time of the dissipative region can be extended or lengthened by increasing the value of the gate resistor $R_{gate}$ as well. These dissipative transitions can be beneficially used to provide some temporary damping for the parasitic resonant circuit.

In a power converter wherein the synchronous rectifier switch $SR_{O2}$ has a gate drive signal derived from the transformer $T_1$, the gate drive voltage is nominally zero during the switching transition because the rectifier switches (in this embodiment, the diode $D_{O1}$ and the synchronous rectifier switch $SR_{O2}$) are temporarily and simultaneously conducting. As a result, a "short circuit" condition occurs across the first secondary winding $SEC_1$ of the transformer $T_1$. To provide a smoother transition for the synchronous rectifier switch $SR_{O2}$, it is preferable that the DC offset bias circuit (e.g., the battery) provide the DC bias voltage $V_{offset}$ (e.g., three to four volts) to the drive voltage that is obtained from the second secondary winding $SEC_2$. The gate drive signal for the synchronous rectifier switch $SR_{O2}$, therefore, is made up of the drive voltage from the second secondary winding $SEC_2$ and the DC bias voltage $V_{offset}$.

Figure 2:
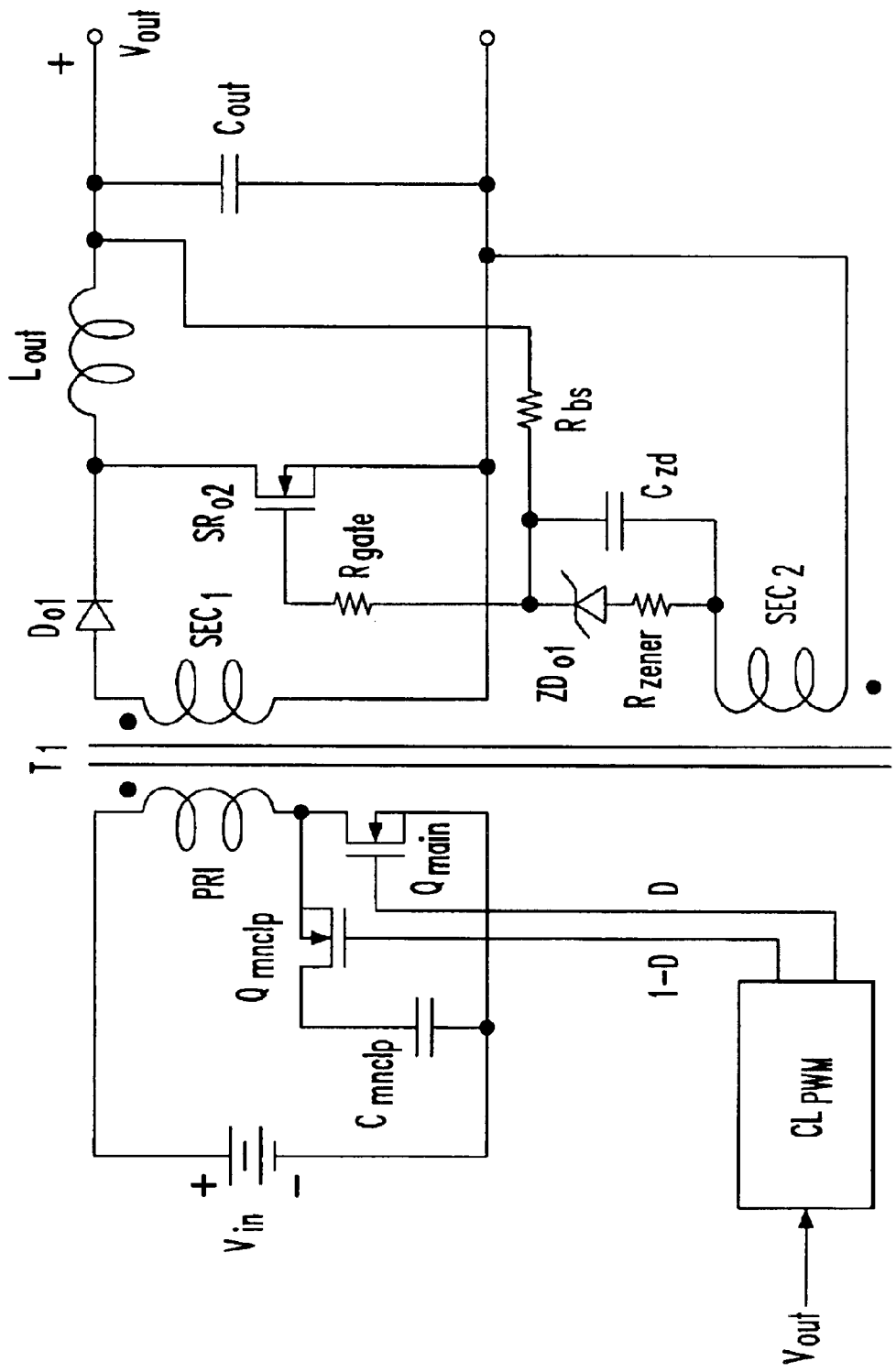
FIG. 2 illustrates a schematic diagram of another embodiment of a power converter constructed according to the principles of the present invention.

Turning now to FIG. 2, illustrated is a schematic diagram of another embodiment of a power converter constructed according to the principles of the present invention. The power converter includes a primary power circuit or inverter driven by a controller (e.g., a pulse width modulator controller) $CL_{PWM}$, a secondary power circuit and a transformer $T_1$ having a primary winding PRI and first and second secondary windings $SEC_1$, $SEC_2$.

The primary power circuit is coupled to a source of input voltage $V_{in}$ and the primary winding PRI of the transformer $T_1$ and includes a main power switch $Q_{main}$ and a main clamp switch $Q_{mnclp}$ that is series-coupled to a main clamp capacitor $C_{mnclp}$ having a clamping voltage thereacross. In the illustrated embodiment, the main clamp switch $Q_{mnclp}$ and the main clamp capacitor $C_{mnclp}$ form a main active clamp circuit, which also functions as a main active clamp transformer reset circuit. As previously mentioned, it should be understood by those skilled in the art that the main active clamp circuit may be positioned at other locations within the power converter.

For the transformer winding senses shown in FIG. 2, the primary power circuit transfers power forward from the primary winding PRI to the first and second secondary windings $SEC_1$, $SEC_2$ during conduction of the main power switch $Q_{main}$ thereby providing a forward portion of an overall switching cycle {represented by a (D) portion of an overall switching cycle}. The main power switch $Q_{main}$ connects the input voltage $V_{in}$ across the primary winding PRI for a main conduction period {again, represented by a (D) portion of an overall switching cycle}. At the conclusion of the main conduction period D, the primary winding PRI is coupled across a difference between the input voltage $V_{in}$ and the clamping voltage across the main clamp capacitor $C_{mnclp}$.

This action is accomplished by the main clamp switch $Q_{mnclp}$, which conducts for an auxiliary conduction period {represented by a (1-D) portion of an overall switching cycle}. The auxiliary conduction period 1-D represents a transformer reset portion of the overall switching cycle that is substantially mutually exclusive of the main conduction period D. Of course, one skilled in the pertinent art realizes that there may be a small overlap or a small gap in the main conduction period D and auxiliary conduction period 1-D due to associated transition times or switching delays. The main clamp capacitor $C_{mnclp}$ allows the magnetic flux through the core of the transformer $T_1$ to be substantially reset to a value exhibited at the beginning of the main conduction period D. Both the main conduction period D and the auxiliary conduction period 1-D are controlled by the controller $CL_{PWM}$. For additional information concerning the operation of main power switch and main clamp switch see U.S. Pat. No. Re 36,571 to Rozman.

The secondary power circuit, coupled to the first and second secondary windings $SEC_1$, $SEC_2$ of the transformer $T_1$, provides an output voltage $V_{out}$ and includes first and second rectifier switches (e.g., a diode $D_{O1}$ and a synchronous rectifier switch $SR_{O2}$), an output inductor $L_{out}$ and an output capacitor $C_{out}$.

For the transformer winding senses shown in FIG. 2, the secondary power circuit couples a secondary voltage associated with the first secondary winding $SEC_1$ to the diode $D_{O1}$ during the main conduction period D. The secondary voltage is coupled through the diode $D_{O1}$ to the output inductor $L_{out}$. Then, during the auxiliary conduction period 1-D, an output inductor current flows through the synchronous rectifier switch $SR_{O2}$. A DC portion of the output inductor current flows through a load (not shown) connected to an output of the power converter. An AC portion of the output inductor current flows through the output capacitor $C_{out}$, which provides a filtering function for the output voltage $V_{out}$.

The power converter also includes a gate driver including a gate resistor $R_{gate}$ and a DC offset bias circuit. In the illustrated embodiment, the DC offset bias circuit includes a series-coupled zener diode $ZD_{O1}$ and resistor $R_{zener}$ coupled in parallel to a capacitor $C_{zd}$. The DC offset bias circuit also includes a bias resistor $R_{bs}$ that provides bias current to the zener diode $ZD_{O1}$. The bias resistor $R_{bs}$ is coupled to a sufficiently high positive voltage source such as a positive terminal associated with the output voltage $V_{out}$ of the power converter. An alternative voltage source may include a positive secondary bias voltage. A small current flows through the bias resistor $R_{bs}$, which causes the zener diode $ZD_{O1}$ to avalanche at its rated voltage, establishing a charge in the capacitor $C_{zd}$ at roughly a zener voltage. The resistor $R_{zener}$ provides a protective impedance for the zener diode $ZD_{O1}$, diverting any brief but large currents to the capacitor $C_{zd}$ which typically occur during rapid discharge of the gate terminal of the synchronous rectifier switch $SR_{O2}$. The net result is that a voltage across the capacitor $C_{zd}$ is sufficient to provide an adequate DC offset voltage as a part of the gate drive signal to the gate terminal of the synchronous rectifier switch $SR_{O2}$.

Thus, analogous to the gate driver of FIG. 1, the illustrated embodiment of the gate driver alleviates the deleterious effects associated with the reverse voltage spikes in rectifier switches that generally occur immediately following a transition from a conducting to a non-conducting state. The gate resistor $R_{gate}$ extends a transition time of the synchronous rectifier switch $SR_{O2}$ and the DC offset bias circuit provides a DC bias voltage to the gate drive signal thereby maintaining a gate voltage of the synchronous rectifier switch $SR_{O2}$ above a gate threshold voltage during a transition period thereof. As a result, the negative effects associated with the reverse voltage spike are dissipated.

Figure 3:
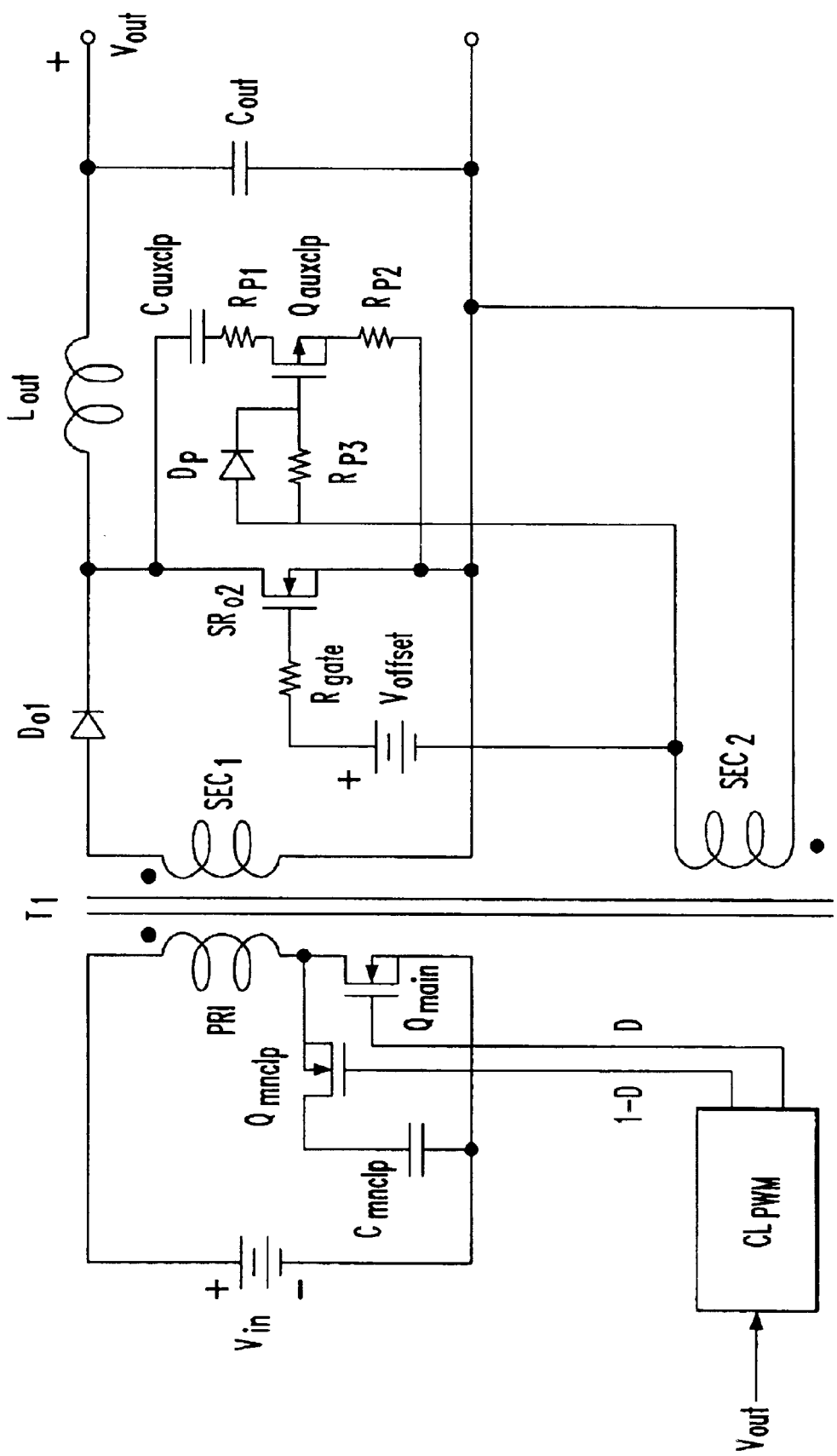
FIG. 3 illustrates a schematic diagram of yet another embodiment of a power converter constructed according to the principles of the present invention.

Turning now to FIG. 3, illustrated is a schematic diagram of yet another embodiment of a power converter constructed according to the principles of the present invention. The power converter includes a primary power circuit or inverter driven by a controller (e.g., a pulse width modulator controller) $CL_{PWM}$, a secondary power circuit and a transformer $T_1$ having a primary winding PRI and first and second secondary windings $SEC_1$, $SEC_2$. The power converter also includes a gate driver having a DC offset bias circuit (e.g., a battery), coupled to the second secondary winding $SEC_2$ of the transformer $T_1$, that provides a gate drive signal having a DC bias voltage $V_{offset}$ to a gate terminal of the synchronous rectifier switch $SR_{O2}$. The gate driver also includes a gate resistor $R_{gate}$ that extends a transition time of the synchronous rectifier switch $SR_{O2}$ from a conducting state to a non-conducting state. Inasmuch as the aforementioned circuits of the power converter are analogous to the circuits that form the power converter illustrated and described with respect to FIG. 1, the operation thereof will not hereinafter be described.

The power converter also includes an auxiliary active clamp circuit as described in U.S. patent application Ser. No. 10/378,418, entitled Auxiliary Active Clamp Circuit and a Power Converter Employing The Same, to Jacobs, et al., which is incorporated herein by reference. The auxiliary active clamp circuit includes an auxiliary clamp switch $Q_{auxclp}$ and an auxiliary clamp capacitor $C_{auxclp}$ coupled across the synchronous rectifier switch $SR_{O2}$. The auxiliary active clamp circuit also includes a protection circuit formed with a diode $D_p$ and first, second and third resistors $R_{p1}$, $R_{p2}$, $R_{p3}$.

The auxiliary active clamp circuit generally operates as follows. During the auxiliary conduction period 1-D, the synchronous rectifier switch $SR_{o2}$ is conducting, the auxiliary clamp switch $Q_{auxclp}$ is not conducting and a voltage substantially equal to, in this case, the input voltage $V_{in}$ multiplied by a secondary-to-primary turns ratio of the transformer $T_1$ builds across the auxiliary clamp capacitor $C_{auxclp}$. At the beginning of the main conduction period D, the synchronous rectifier switch $SR_{o2}$ is transitioned to a non-conducting state and, preferably, at substantially the same time, the auxiliary clamp switch $Q_{auxclp}$ is transitioned to a conducting state. Even if the timing of the transition of the auxiliary clamp switch $Q_{auxclp}$ is delayed, the body diode of the auxiliary clamp switch $Q_{auxclp}$ conducts to allow the auxiliary active clamp circuit to serve its intended function. In the illustrated embodiment, the drive signal for the auxiliary clamp switch $Q_{auxclp}$ is derived from the second secondary winding $SEC_2$ of the transformer $T_1$.

As a result, the auxiliary active clamp circuit clamps a voltage across the synchronous rectifier switch $SR_{o2}$ at a clamping voltage during the main conduction period D of the power converter. In this case, the clamping voltage is equal to the off-state voltage of the synchronous rectifier switch $SR_{o2}$, which is approximately the input voltage $V_{in}$ multiplied by a secondary-to-primary turns ratio of the transformer $T_1$.

Again, the first auxiliary active clamp circuit also includes a protection circuit formed with a diode $D_p$ and first, second and third resistors $R_{p1}$, $R_{p2}$, $R_{p3}$. Ones of the first and second resistors $R_{p1}$, $R_{p2}$ are in series with source and drain of the auxiliary clamp switch $Q_{auxclp}$. The first resistor $R_{p1}$ limits a shoot-through current through the auxiliary clamp switch $Q_{auxclp}$, which, if unchecked, could cause the auxiliary clamp switch $Q_{auxclp}$ to conduct excessively and discharge the auxiliary clamp capacitor $C_{auxclp}$. Similarly, the second resistor $R_{p2}$ limits a shoot-through current through the auxiliary clamp switch $Q_{auxclp}$. The diode $D_p$ and third resistor $R_{p3}$ delays a turn-on time of the auxiliary clamp switch $Q_{auxclp}$ to, again, limit a shoot-through current through the auxiliary clamp switch $Q_{auxclp}$. As a result, the auxiliary active clamp circuit clamps a voltage across the synchronous rectifier switch $SR_{O2}$ at a clamping voltage during the auxiliary conduction period 1-D of the power converter. The auxiliary active clamp circuit in conjunction with the gate driver further enhances the operation of the rectifier switches and, ultimately, the power converter employing the circuits to advantage.

Thus, a gate driver for use with a rectifier switch has been introduced into a power converter with readily attainable and quantifiable advantages. Those skilled in the art should understand that the previously described embodiments of the gate driver, method of operation thereof and power converter are submitted for illustrative purposes only and that other embodiments capable of mitigating the adverse effects of the reverse voltage phenomenon associated with the rectifier switch are well within the broad scope of the present invention.

Additionally, exemplary embodiments of the present invention have been illustrated with reference to specific electronic components. Those skilled in the art are aware, however, that components may be substituted (not necessarily with components of the same type) to create desired conditions or accomplish desired results. For instance, multiple components may be substituted for a single component and vice-versa. The principles of the present invention may be applied to a wide variety of power circuit topologies. For a better understanding of a variety of power converter topologies, see *Modern DC-to-DC Switchmode Power Converter Circuits*, by Rudolph P. Severns and Gordon Bloom, Van Nostrand Reinhold Company, New York, N.Y. (1985) and *Principles of Power Electronics*, by J. G. Kassakian, M. F. Schlecht and G. C. Verghese, Addison-Wesley (1991), which are incorporated herein by reference in their entirety.

Although the present invention has been described in detail, those skilled in the art should understand that they can make various changes, substitutions and alterations herein without departing from the spirit and scope of the invention in its broadest form.

What is claimed is:

1. For use with a power converter having a main active clamp circuit associated with a main power switch coupled to a primary winding of a transformer and a rectifier switch coupled to a secondary winding of said transformer, said main power switch configured to conduct during a main conduction period of said power converter and said rectifier switch configured to conduct during an auxiliary conduction period of said power converter, a gate driver, comprising:

a DC offset bias circuit, coupled to a secondary winding of said transformer, configured to provide a gate drive signal having a DC bias voltage to a gate terminal of said rectifier switch.

2. The gate driver as recited in claim 1 further comprising a resistor, coupled in series with said gate terminal of said rectifier switch, configured to extend a transition time of said rectifier switch from a conducting state during said auxiliary conduction period to a non-conducting state.

3. The gate driver as recited in claim 1 wherein said DC offset bias circuit comprises a battery.

4. The gate driver as recited in claim 1 wherein said DC offset bias circuit comprises a zener diode.

5. The gate driver as recited in claim 4 wherein said DC offset bias circuit further comprises a capacitor coupled in parallel to said zener diode.

6. The gate driver as recited in claim 4 wherein said DC offset bias circuit further comprises a resistor coupled to said zener diode.

7. The gate driver as recited in claim 1 wherein said rectifier switch is a synchronous rectifier switch.

8. For use with a power converter having a main active clamp circuit associated with a main power switch coupled to a primary winding of a transformer and a rectifier switch coupled to a secondary winding of said transformer, said main power switch conducts during a main conduction period of said power converter and said rectifier switch conducts during an auxiliary conduction period of said power converter, a method of driving said rectifier switch, comprising:

coupling a DC offset bias circuit to a secondary winding of said transformer and a gate terminal of said rectifier switch; and providing a gate drive signal having a DC bias voltage via said DC offset bias circuit to a gate terminal of said rectifier switch.

9. The method as recited in claim 8 further comprising extending a transition time of said rectifier switch from a conducting state during said auxiliary conduction period to a non-conducting state.

10. The method as recited in claim 8 wherein said DC offset bias circuit comprises a battery to provide said DC bias voltage.

11. The method as recited in claim 8 wherein said DC offset bias circuit comprises a zener diode.

12. The method as recited in claim 11 wherein said DC offset bias circuit further comprises a capacitor coupled in parallel to said zener diode, said zener diode and capacitor cooperating to provide said DC bias voltage.

13. The method as recited in claim 11 further comprising providing a bias current to said zener diode.

14. A power converter, comprising:

a main power switch coupled to an input of said power converter that conducts during a main conduction period of said power converter;

a main active clamp circuit associated with said main power switch;

a transformer having a primary winding coupled to said main power switch;

a rectifier coupled to a secondary winding of said transformer and including a rectifier switch that conducts during an auxiliary conduction period of said power converter; and a gate driver, including:

a DC offset bias circuit, coupled to a secondary winding of said transformer, that provides a gate drive signal having a DC bias voltage to a gate terminal of said rectifier switch.

15. The power converter as recited in claim 14 wherein said gate driver further comprises a resistor, coupled in series with said gate terminal of said rectifier switch, that extends a transition time of said rectifier switch from a conducting state during said auxiliary conduction period to a non-conducting state.

16. The power converter as recited in claim 14 wherein said DC offset bias circuit comprises a battery.

17. The power converter as recited in claim 14 wherein said DC offset bias circuit comprises a zener diode coupled in parallel to a capacitor, said DC offset bias circuit further comprising a resistor coupled to said zener diode.

18. The power converter as recited in claim 14 wherein said rectifier switch is a synchronous rectifier switch.

19. The power converter as recited in claim 14 further comprising an auxiliary active clamp circuit associated with said rectifier switch.

20. The power converter as recited in claim 19 wherein said auxiliary active clamp circuit, comprises:

an auxiliary clamp capacitor, coupled across said rectifier switch, that stores a clamping voltage substantially equal to an off-state voltage of said rectifier switch; and an auxiliary clamp switch, coupled in series with said auxiliary clamp capacitor, that receives a drive signal from a secondary winding of said transformer and conducts during said main conduction period thereby clamping a voltage across said rectifier switch at about said clamping voltage.

* * * * *